(12) United States Patent
Regier (10) Patent No.: US 7,327,189 B2
(45) Date of Patent: Feb. 5, 2008

(54) DIFFERENTIAL STRUCTURE PROGRAMMABLE GAIN INSTRUMENTATION AMPLIFIER

(75) Inventor: Christopher G. Regier, Austin, TX (US)

(73) Assignee: National Instruments Corporation, Austin, TX (US)

( * ) Notice: Subject to any disclaimer, the term of this patent is extended or adjusted under 35 U.S.C. 154(b) by 237 days.

(21) Appl. No.: 11/205,691

(22) Filed: Aug. 17, 2005

(65) Prior Publication Data

US 2006/0038615 A1    Feb. 23, 2006

Related U.S. Application Data

(60) Provisional application No. 60/602,216, filed on Aug. 17, 2004.

(51) Int. Cl.
  *H03F 3/45*    (2006.01)
(52) U.S. Cl. .......................................... 330/69; 330/260
(58) Field of Classification Search .................. 330/69, 330/260
  See application file for complete search history.

(56) References Cited

U.S. PATENT DOCUMENTS

| | | | |
|---|---|---|---|
| 4,833,422 A | 5/1989 | Atwell | |
| 5,157,348 A | 10/1992 | Deveau | |
| 5,233,309 A | 8/1993 | Spitalny et al. | |
| 5,327,098 A | 7/1994 | Molina et al. | |
| 5,486,791 A | 1/1996 | Spitalny et al. | |
| 5,999,052 A | 12/1999 | Tang | |
| 6,018,269 A | 1/2000 | Viswanathan | |
| 6,049,252 A | 4/2000 | Iwata | |

(Continued)

OTHER PUBLICATIONS

A. S. Sedra and G. W. Roberts; "Current conveyor theory and practice," 1990; Chapter 3, pp. 93-126; Peter Peregrinus Ltd.: London.
"Quick Glossary of commonly used DSA-related terms and acronyms"; 2004; 3 pages; National Instruments Corporation.

(Continued)

*Primary Examiner*—Steven J. Mottola
(74) *Attorney, Agent, or Firm*—Meyertons Hood Kivlin Kowert & Goetzel, P.C.; Jeffrey C. Hood (57) ABSTRACT

In one embodiment, a programmable gain instrumentation amplifier (PGIA) comprises a pair of current conveyors, each current conveyor having a respective sense node and a respective voltage input, with a gain-setting resistor coupled between the respective sense nodes, and current being sensed on both sides of the gain setting resistor. In one embodiment, each current conveyor comprises a corresponding operational amplifier (op-amp) having a non-inverting input configured as the respective voltage input that may receive a respective input voltage signal, an output and an inverting input, with a respective current conveying element, which may be a FET, configured in a feedback loop between the output and the inverting input. Each current conveyor may be configured to sense a corresponding current flowing through its respective FET, with the corresponding currents forming a differential output current of the PGIA. The respective input voltage signals received by the respective voltage inputs may form a differential input voltage of the PGIA. In one set of embodiments, the PGIA may be implemented with a differential voltage output, leading to an increased output swing for higher signal-to-noise ratio and increased symmetry for a higher common mode rejection ratio.

29 Claims, 6 Drawing Sheets

U.S. PATENT DOCUMENTS

| | | | |
|---|---|---|---|
| 6,060,956 A * | 5/2000 | Mole et al. | 331/117 R |
| 6,084,466 A * | 7/2000 | Phanse et al. | 330/254 |
| 6,791,415 B2 * | 9/2004 | Mitteregger | 330/260 |
| 6,833,759 B2 | 12/2004 | Sobel | |
| 6,844,740 B2 | 1/2005 | Hidaka | |
| 6,847,904 B2 | 1/2005 | Blake et al. | |
| 6,888,405 B2 | 5/2005 | Cheung et al. | |
| 6,958,648 B2 | 10/2005 | Cheung et al. | |
| 7,026,875 B2 | 4/2006 | Sobel | |

OTHER PUBLICATIONS

Richard House; "Data Acquisition Specifications—a Glossary"; Application Note 092; Feb. 1997; 20 pages; National Instruments Corporation.

Scott Kasin; "Is Your Data Inaccurate Because of Instrumentation Amplifier Settling Time?"; Aug. 1993; 10 pages; National Instruments Corporation.

* cited by examiner

Fig. 14

DIFFERENTIAL STRUCTURE PROGRAMMABLE GAIN INSTRUMENTATION AMPLIFIER

PRIORITY CLAIM

This application claims benefit of priority of provisional application Ser. No. 60/602,216 titled "Differential Structure Programmable Gain Instrumentation Amplifier" and filed Aug. 17, 2004, which is hereby incorporated by reference as though fully and completely set forth herein.

BACKGROUND OF THE INVENTION

1. Field of the Invention

This invention relates generally to measurement and data acquisition systems and, more particularly, to instrumentation amplifier design.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a UUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications.

Generally, signals that are being measured using a DAQ system are first routed from a particular channel via a multiplexer. The signals then enter an instrumentation amplifier, typically a programmable gain instrumentation amplifier (PGIA). The PGIA typically applies a specified amount of gain to an input signal, which raises the signal to a higher level and ensures proper A/D conversion. The amplifier may also convert differential input signals applied to the DAQ board to a single-ended output so that the ADC can correctly digitize the data. The ADC may then sample and hold the signal until the signal is digitized and placed into a FIFO buffer on the board. In the FIFO, the digitized signal is ready to be transferred from the board to computer memory via the PC bus for further processing. PGIA performance is generally considered an important aspect of DAQ systems. For example, the PGIA must settle before the A/D conversion takes place or the converted data may be inaccurate. The time needed to amplify the signal to the higher level while maintaining the accuracy of the ADC—in other words, the settling time of the instrumentation amplifier—may also be a concern when using plug-in DAQ boards.

Traditional PGIAs typically use operational amplifiers (op-amps) with multiplexers to switch feedback networks, which may not always facilitate the required performance, namely linearity and speed, at desired levels. One possible improvement has been the implementation of PGIAs with current conveyors, which have the capability to keep the linearity and speed of PGIAs at levels consistent with more stringent performance requirements. Typical PGIAs that use current conveyors and are currently available on the market are slowed by global feedback or have other limitations, providing what may be insufficient performance for certain DAQ systems.

Other corresponding issues related to the prior art will become apparent to one skilled in the art after comparing such prior art with the present invention as described herein.

SUMMARY OF THE INVENTION

In one set of embodiments, the input stage of a programmable gain instrumentation amplifier (PGIA) may be implemented using precision current conveyors differentially. Two current conveyors may be configured to sense respective currents on the two sides of a gain resistor. In some embodiments, multiple gain resistors may form a single resistive element, where the respective currents may be sensed on the two sides, respectively, of the single resistive element.

In one embodiment, the input stage of a PGIA may include a pair of operational amplifiers (op-amps), the non-inverting input of each op-amp configured to receive a respective input voltage, and the inverting input of each op-amp configured as a respective feedback input and sense node for sensing voltage. The input stage may further include a pair of current conveying elements, which may be field effect transistors (FETs), with each FET configured in a respective feedback loop between the output and the sense node of a respective one of the pair of op-amps. A gain-setting resistive element may be coupled between the respective sense nodes of the pair of op-amps, and respective currents flowing through the respective FETs may form a differential output current of the PGIA. Respective input voltages received by the respective non-inverting inputs of the pair of op-amps may form a differential input voltage of the PGIA.

In one embodiment, in lieu of a single gain-setting resistive element the input stage of the PGIA may be configured with multiple gain setting resistors from which any one resistor may be selected at a time by a pair of double multiplexers, thereby enabling gain switching. Each double-multiplexer may have a first and a second component multiplexer, and each double multiplexer may be coupled between one end of the multiple gain setting resistors and a respective precision current conveyor. The first component multiplexer may be used to route the sense current of a respective precision current conveyor from any currently selected resistor to a newly selected resistor, and the second component multiplexer may be used to switch the sense point of the respective precision current conveyor to the same newly selected resistor.

In one embodiment, an output circuit may be implemented to convert the differential output current produced by the input stage of the PGIA to a differential output voltage. The differential output voltage may be produced by a pair of output op-amps and may provide an increased output swing for higher signal to noise ratio (SNR) and increased symmetry for higher common mode rejection ratio (CMRR). The output circuit may be configured with a composite differential I/V converter design used in establishing the voltage potential at which the currents are sensed. Each input of a low noise op-amp may be coupled to a respective inverting input of a respective one of the pair of output op-amps, with the output of the low noise op-amp coupled to a respective non-inverting input of one of op-amps. In this configuration, the output op-amps may be selected to have a high operating speed without a requirement for them to be highly precise. Benefits of this configuration may include high operating speed and low noise, where both factors may be optimized independently. In some embodiments, bias current may be reduced by coupling a respective FET with a corresponding respective biasing current source to the inverting input of each op-amp, with the drain of the FET coupling to a positive rail voltage, the source of the FET coupling to the inverting input of the op-amp and the gate of the FET serving as the new inverting input for the op-amp.

In one embodiment, the output common-mode voltage of the output circuit may be set according to a common-mode feedback configuration. In this configuration, the individual components of the differential output voltage may each be responsive to the differential input current as opposed to each individual component of the differential output voltage being responsive to the respective individual component of the differential input current. Additionally, without common-mode feedback, all supply voltages and bias currents may need to be set precisely in order to obtain the correct output common-mode voltage. The common-mode feedback configuration may be implemented with output clamping using a respective diode configured in the respective feedback path of each respective one of the pair of output op-amps. Each diode may keep the respective output voltage of the respective output op-amp from exceeding a voltage level that is the equivalent of the I/V converter's corresponding current-sensing node. Common-mode feedback ensures that when one voltage output (of the differential voltage output) is clamped in the positive direction, the other voltage output is clamped in the negative direction. In one set of embodiments, the diodes may be base-collector junctions of high-speed bipolar junction transistors (BJTs), which may provide a combination of low capacitance, low leakage, and high speed. In alternate embodiments, the diodes may be implemented using other structures and/or designs functionally equivalent to diodes.

In one embodiment, the precision current conveyors may be designed to prevent op-amp saturation without causing extra current flow and/or to maintain a stable feedback loop during overload conditions. In one set of embodiments, the op-amps used in implementing the precision current conveyors may be bootstrapped by moving the supply rails with the input and output signals, in order to improve the op-amps' large-signal behavior, including slew rate and common-mode rejection.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

As used herein, a "bootstrap" circuit or "bootstrapping" circuit refers to a circuit configured to drive the power rails of a specified circuit or specified sub-circuit with a signal that is substantially similar to the signal the specified circuit is configured to process, in order to make the signal appear small to the circuit. This may allow the specified circuit to operate in a more linear manner and to present a more manageable load to the signal. Furthermore, a "double multiplexer" refers to two multiplexers switching in concert, that is, the two multiplexers are selecting the same corresponding channels at the same time. For example, a signal may be an input to a first channel of a first multiplexer and another signal may be an input to a first channel of a second multiplexer. Then, whenever the first multiplexer is operated to select its respective first channel, the second multiplexer is operated to simultaneously select its own respective first channel. In some embodiments, the same input may be coupled to respective corresponding channels of the two multiplexers, for example a single signal may be an input to the first channel of the first multiplexer and to the first channel of the second multiplexer.

In addition, a "current conveyor" refers to a three-terminal device configured such that a voltage applied at the first terminal of the device is substantially reproduced at the second terminal of the device, and a current applied at the second terminal of the device is substantially reproduced at the third terminal of the device. A "current conveying element" may refer to any circuit element and/or component that may exhibit characteristics of a current conveyor. For example, a field effect transistor (FET) may be considered a current conveying element if the gate of the FET is configured as the first terminal of a current conveyor, the source of the FET is configured as the second terminal of the current conveyor, and the drain of the FET is configured as the third terminal of the current conveyor.

Figure 1:
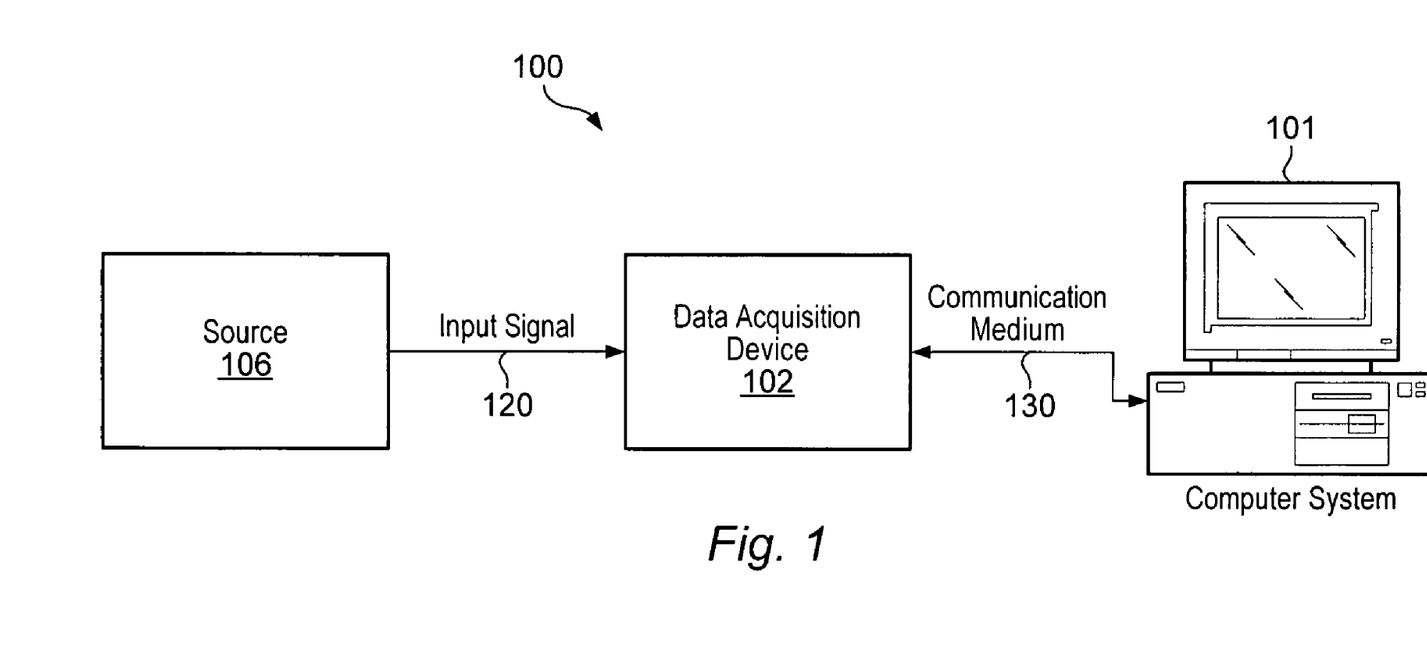
FIG. 1 is a diagram of one embodiment of a computer-based measurement system or data acquisition system.

FIG. 1 is a diagram of one embodiment of a computer-based measurement system or data acquisition system 100. The data acquisition system 100 may comprise a computer system 101, which may be coupled to a measurement device, referred to as data acquisition (DAQ) device 102, through a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, PXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor, which is comprised in a unit under test (UUT). In this example, the DAQ device 102 may receive temperature reading from the temperature sensor and convert the analog data to digital form to be sent to the computer system 101 for analysis. Additionally, the DAQ device 102 may receive a digital input, e.g., a binary pattern, from the external source 106 (e.g., a UUT). Furthermore, the DAQ device 102 may also produce analog or digital signals, e.g., for stimulating the UUT.

The computer system 101 may be operable to control the DAQ device 102. For example, the computer system 101 may be operable to direct the DAQ device 102 to perform an acquisition, and may obtain data from the DAQ device 102 for storage and analysis therein. Additionally, the computer system 101 may be operable to send data to the device 102 for various purposes, such as for use in generating analog signals used for stimulating a UUT.

The computer system 101 may include a processor, which may be any of various types, including an x86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Figure 2:
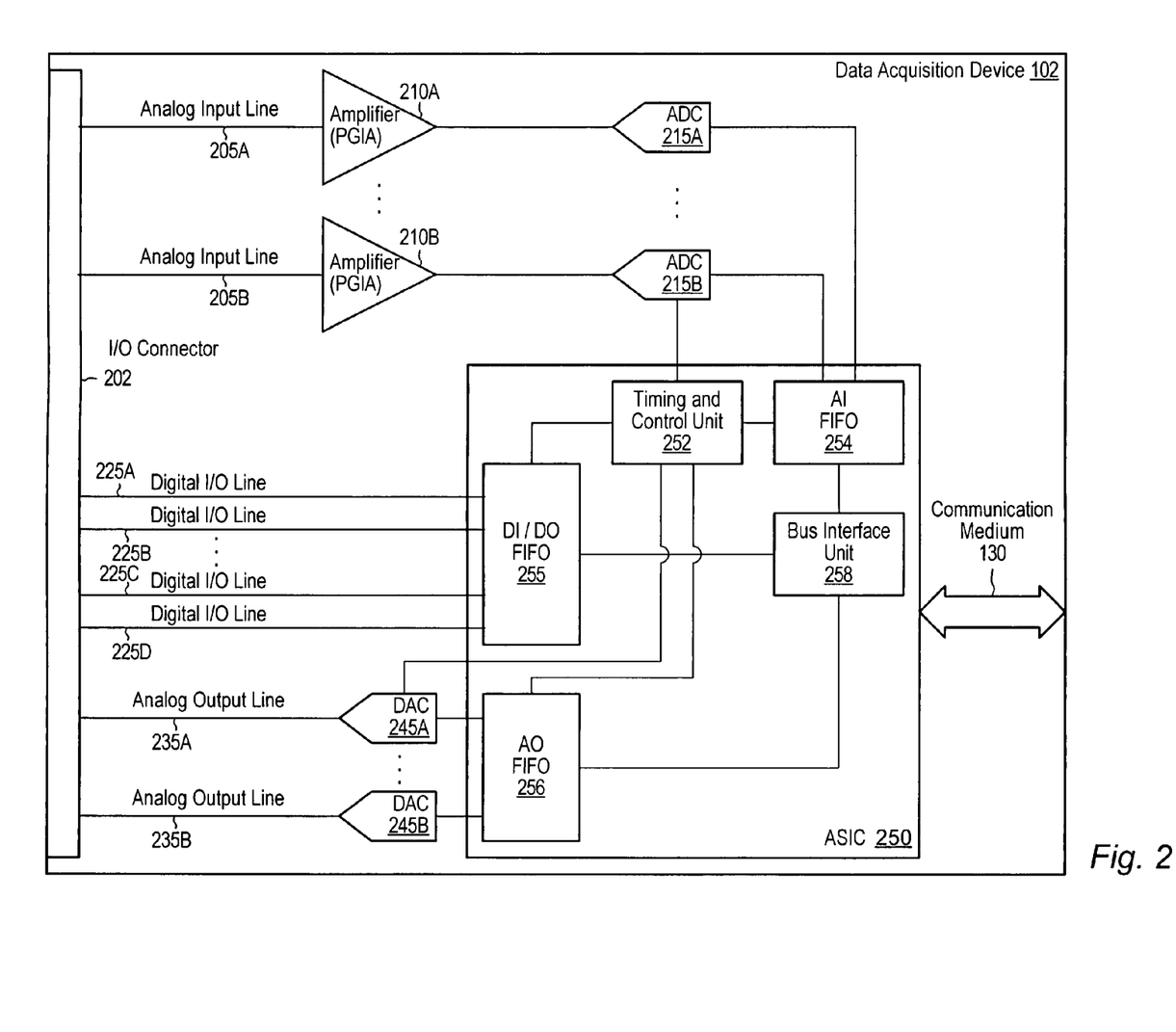
FIG. 2 is a block diagram of one embodiment of a data acquisition (DAQ) device.

FIG. 2 is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., PXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, amplifiers 210A and 210B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, and communication medium 130. It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

The DAQ device 102 may receive and send digital and/or analog data via the input and output lines of the I/O connector 202. For example, the I/O connector 202 may be coupled to a signal source (e.g., source 106 of FIG. 1) comprised in a UUT to receive analog signals. The I/O connector 202 may comprise analog input lines 205A and 205B, which may convey the received analog signals to amplifier 210A and 210B. It is noted however that in other embodiments the DAQ device 102 may comprise any number of analog input lines, e.g., three or more analog input lines.

In one embodiment, amplifiers 210A and 210B may be programmable gain instrumentation amplifiers (PGIAs). PGIAs are typically differential amplifiers having a high input impedance and a gain that is adjustable through the variation of digital control lines. The amplifier 210A may apply a specified amount of gain to the input signal to ensure proper analog-to-digital conversion. Also, PGIAs may convert differential input signals into single-ended outputs, which may be needed for the ADC (e.g., ADC 215A) to correctly digitize the data. It is noted however that in other embodiments amplifier 210A and/or amplifier 210B may be other types of amplifiers typically used in data acquisition devices. It is also noted that DAQ device 102 may comprise any number of amplifiers, e.g., three or more amplifiers.

The output of amplifier 210A may be connected to ADC 215A, which may digitize the analog signals. ADCs are devices that convert a continuously varying (analog) signal into a discrete (digital) signal. The resolution of the ADC typically indicates the number of discrete values it can produce. For example, if the ADC has an eight-bit resolution, the ADC may be able to encode an analog input to one of 256 discrete values (since $2^8=256$). Each discrete value is derived by sampling the analog signal at a predetermined rate (i.e., the sampling rate of the ADC). More specifically, the signal values at particular time intervals are measured and stored. An ADC typically includes a sample and hold circuit, which holds the input value constant during the time the ADC performs the analog-to-digital conversion, since the ADC cannot make an instantaneous conversion. It is noted however that in other embodiments the DAQ device 102 may comprise any number of ADCs, for example, the DAQ device 102 may include a single ADC or four ADCs.

After the signals are digitized, the ADC 215A may send the digital signals to the ASIC 250. In one embodiment, the ASIC 250 may be a mixed-signal ASIC, which may be configured to perform the timing and data control functions for the DAQ device 102. It is noted however that in other embodiments other types of timing and data control ICs may be used. The ASIC 250 may include a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

When the ASIC 250 receives the digitized signals, the data may be stored in AI FIFO buffer 254. FIFO buffers are storage devices that output the stored data in the order the data was received. After being stored in the AI FIFO buffer 254, the digitized data may be sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the digitized data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. DACs are devices that convert discrete (digital) signals into continuously varying (analog) signals. For example, if an analog signal was initially converted to digital form, a DAC may be able to reproduce the analog signal if provided with the digital data. However, according to the Nyquist sampling theorem, reproduction is typically only possible if the sampling rate is higher than twice the frequency of the highest output frequency to be reproduced. It is noted that the DAQ device 102 may comprise any number of DACs, for example, other embodiments may include a single DAC or three DACs. After the digital data is converted to analog form, the analog signals may be sent to the I/O connector 202 via the analog output line 235A.

In one embodiment, digital signals may be received at the I/O connector 202. The received digital signals may be sent to the ASIC 250 via one or more of the digital I/O lines 225A-D. In one embodiment, the digital I/O lines 225A-D are general-purpose, bidirectional digital I/O lines, which may be configured to send and receive digital data. When the ASIC 250 receives the digital signals, the data may be stored in the DI/DO FIFO buffer 255. After being stored in the DI/DO FIFO buffer 255, the digital data may be sent to the bus interface unit 258, which may convey the digital data to the computer system 101, as described above. It is noted that digital data received via the bus interface unit 258 may also be stored in DI/DO FIFO buffer 255 before being sent to the I/O connector 202 via one or more of the digital I/O lines 225A-D.

The ASIC 250 may include the timing and control unit 252 to provide timing and control and data management functions for the DAQ device 102 during, e.g., a data acquisition process. The timing and control unit may comprise one or more counter/timers, which may be used in various applications, including counting the occurrences of a digital event, digital pulse timing, and generating square waves and pulses. The timing and control unit 252 may be coupled to one or more of the FIFO buffers (e.g., AO FIFO buffer 256) of the DAQ device 102 to provide timing and control signals for storing data received from, e.g., the bus interface 258 or the ADC 215A, and for sending data to, e.g., DAC 245A. Furthermore, the timing and control unit 252 may be coupled to the ADCs (e.g., ADC 215A) and DACs (e.g., ADC 245A) of the DAQ device 102 to provide timing and control signals for performing the data conversion functions that may be necessary in a data acquisition process.

In one embodiment, the timing and control unit 252 and/or the bus interface unit 258 may be implemented in hardware. In a further embodiment, the timing and control unit 252 and/or the bus interface unit 258 may be implemented in software. In yet another embodiment, the timing and control unit 252 and/or the bus interface unit 258 may be implemented in both hardware and software. In one embodiment, the functionality described above with regard to the timing and control unit 252 and/or the bus interface unit 258 may be distributed across multiple components. In various embodiments, this type of functional distribution may also apply to other components described herein.

As previously pointed out, use of a current conveyor structure in a PGIA circuit/design may facilitate maintaining consistent performance of the PGIA, namely consistent linearity and speed, as the gain is increased. A precision current conveyor may provide improved performance over a typical current conveyor by featuring a current conveying element configured in the feedback loop of, for example, an op-amp, which may force its current sensing node to reside precisely at the correct potential. In one set of embodiments, PGIAs 210a and 210b may be constructed using precision current conveyors differentially. That is, PGIA circuits 210a and 210b may each be constructed based on respective precision differential current conveyors sensing current on both sides of a gain-setting resistor or gain-setting resistors.

Figure 3:
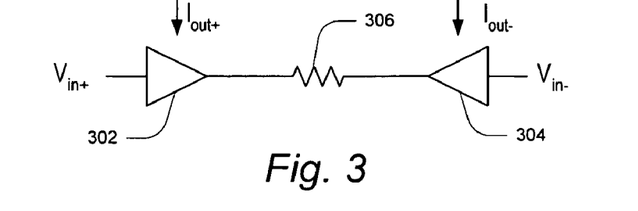
FIG. 3 illustrates one embodiment of a PGIA input circuit configured using a differential current conveyor structure.

One embodiment of the input stage of PGIA 210a and/or PGIA 210b using precision current conveyors differentially is illustrated in FIG. 3. The embodiment of FIG. 3 features a precision differential current conveyor structure that includes precision current conveyors 302 and 304, and currents $I_{out+}$ and $I_{out-}$ that are sensed on the two sides, respectively, of a gain resistor 306. Although a single gain resistor is shown in FIG. 3, gain resistor 306 may be representative of multiple gain resistors forming a single resistive element, where $I_{out+}$ and $I_{out-}$ may be sensed on the two sides, respectively, of the single resistive element. The transconductance of the structure shown in FIG. 3 may be expressed by the proportional relationship $$\text{Transconductance} \approx I_{out\_}\text{diff}/V_{in\_}\text{diff}, \quad (1)$$

where $I_{out\_}$diff represents the differential output current, and $V_{in\_}$diff represents the differential input voltage.

Figure 4:
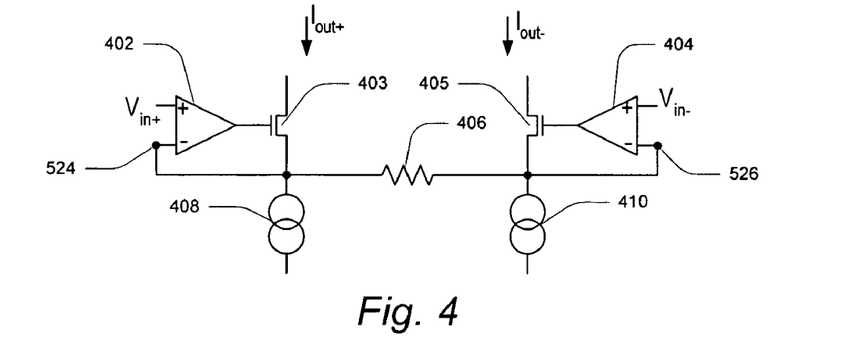
FIG. 4 illustrates one embodiment of the structure of FIG. 3 using op-amps.

One embodiment of the structure of FIG. 3 using op-amps is shown in FIG. 4. By way of example, precision current conveyor 302 may be formed using op-amp 402 whose output may be configured to drive the gate of transistor 403, with the source of transistor 403 coupled to biasing current source 408. Precision current conveyor 304 may be similarly formed using op-amp 404, transistor 405, and biasing current source 410. Current may be sensed on the two sides of gain resistor 406. As previously indicated, transistor 405 configured in the feedback loop of op-amp 404 may operate to keep current sensing node 526 substantially at the desired potential. Similarly, transistor 403 configured in the feedback loop of op-amp 402 may operate to keep current sensing node 524 substantially at the desired potential.

Figure 5:
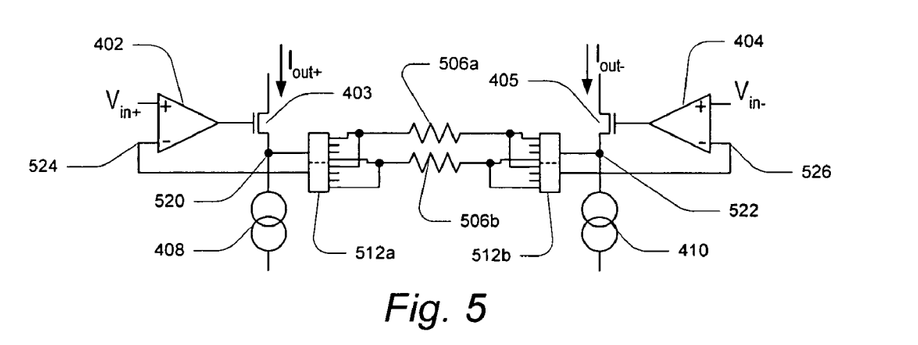
FIG. 5 illustrates one embodiment of the structure of FIG. 3 using double multiplexers at each end of the gain-setting resistors for gain switching.

FIG. 5 shows another embodiment of the structure of FIG. 3. This embodiment is similar to the structure of the circuit in FIG. 4, with the addition of double multiplexers 512a and 512b that are placed at each end of gain-setting resistors 506a and 506b, respectively, for gain switching. Double multiplexers 512a and 512b may be used for switching between gain resistors 506a and 506b, where one component of the double-multiplexer may be used to switch the current from one resistor to another, and the other component of the double-multiplexer may be used to switch the op-amp sense point to the correct resistor. For example, double multiplexer 512a may be configured such that a current-switching multiplexer component of multiplexer 512a switches biasing current source 408—and thus the current flowing through node 520—from gain resistor 506a to gain resistor 506b and/or vice versa, and a sense-multiplexer component of multiplexer 512a switches op-amp 402 sense point 524 to the currently selected one from gain resistors 506a and 506b. Double multiplexer 512b may be similarly configured for biasing-current source 410, current node 522, and op-amp 404 sense point 526.

In the embodiment shown in FIG. 5, op-amps 402 and 404 may operate to compensate for any voltage error(s) that may be incurred by signal currents flowing through the "on" resistance of the current-switching multiplexer component of their respective double multiplexer (512a or 512b). In one embodiment, the respective sense-multiplexer components of multiplexers 512a and 512b carry no signal current, so they are not operable to introduce a voltage error. A double multiplexer may be used on each side of the gain-setting resistors, for a grand total of four gain multiplexers switching in concert, as embodied by double multiplexer 512a configured on the left side of gain-setting resistors 506a and 506b, and double multiplexer 512b configured on the right side of gain-setting resistors 506a and 506b.

Figure 6:
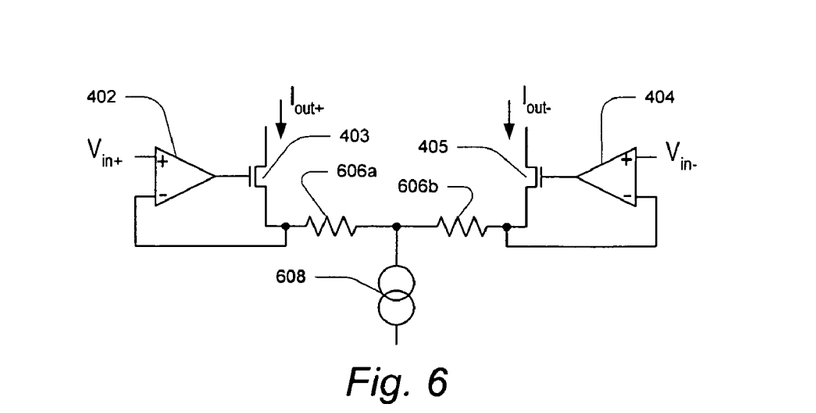
FIG. 6 shows one embodiment of the structures of FIG. 3 and FIG. 4, with biasing implemented with a single current source instead of two current sources.

FIG. 6 shows another embodiment of the structure of FIG. 3, with biasing implemented with a single current source 608, instead of the two current sources 408 and 410 that were configured in the embodiment shown in FIG. 4. In the embodiment shown in FIG. 6, gain-setting resistors 606a and 606b may be center tapped (as shown), with the center taps tied together, thus enabling the use of a single current source, such as current source 608. This implementation may lead to reduced noise and less sensitivity to the accuracy of the current source, since errors that may be present would be common-mode.

Figure 7:
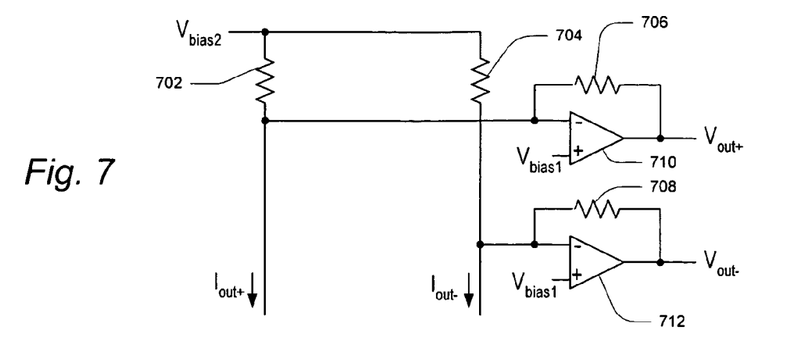
FIG. 7 shows one embodiment of a PGIA output stage configured with differential outputs.

The circuits of FIG. 3 through FIG. 6 provide differential output currents $I_{out+}$ and $I_{out-}$ given differential input voltages $V_{in+}$ and $V_{in-}$. An output circuit may be implemented to convert the differential output currents to differential output voltages. FIG. 7 shows one embodiment of a PGIA output stage with differential outputs configured from the respective outputs of two single ended converters. In this embodiment, the outputs of op-amps 710 and 712 provide the differential voltage output comprising $V_{out+}$ and $V_{out-}$, respectively. The circuit in FIG. 7 may operate as a current-to-voltage (I/V) converter, with the differential current comprising $I_{out+}$ and $I_{out-}$, corresponding to the differential voltage output comprising $V_{out+}$ and $V_{out-}$. As shown in the embodiment of FIG. 7, $V_{out+}$ is responsive to $I_{out+}$ while $V_{out-}$ is responsive to $I_{out-}$. Biasing of the circuit may be provided through resistors 702, 704 and feedback resistors 706 and 708, with a first bias voltage $V_{bias1}$ applied to the inverting inputs of op-amps 710 and 712, and a second bias voltage $V_{bias2}$ applied resistors 702 and 704. Differential voltage outputs $V_{out+}$ and $V_{out-}$ may provide an increased output swing for higher signal to noise ratio (SNR) and increased symmetry for higher common mode rejection ratio (CMRR).

Figure 8:
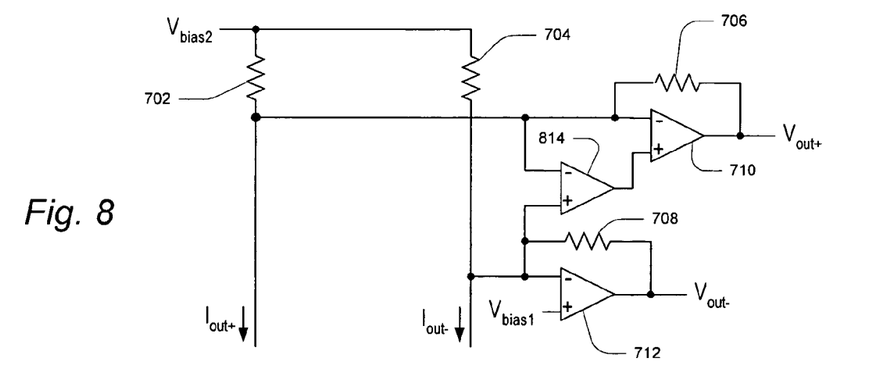
FIG. 8 shows one embodiment of the differential output implemented with a composite differential current-to-voltage (I/V) design.

FIG. 8 shows one embodiment of the circuit shown in FIG. 7 configured with a composite differential I/V converter design used in establishing the voltage potential at which the currents are sensed. A low noise op-amp 814 may be coupled between the inverting inputs of op-amps 710 and 712, with the output of op-amp 814 coupled to the non-inverting input of op-amp 710 in lieu of the previously coupled $V_{bias1}$ input. In this configuration, op-amps 710 and 712 may be selected to have a high operating speed without a requirement for op-amps 710 and 712 to be highly precise.

In the configuration shown in FIG. 8, op-amp 814 forces the voltage errors of opamps 710 and 712 to be the same, resulting in zero differential output error. Benefits of this configuration include high operating speed and low noise. Because the speed and noise may be controlled through different op-amps—as mentioned, op-amp 710 substantially determining the speed and op-amp 814 substantially determining the noise—both factors may be optimized independently.

Figure 9:
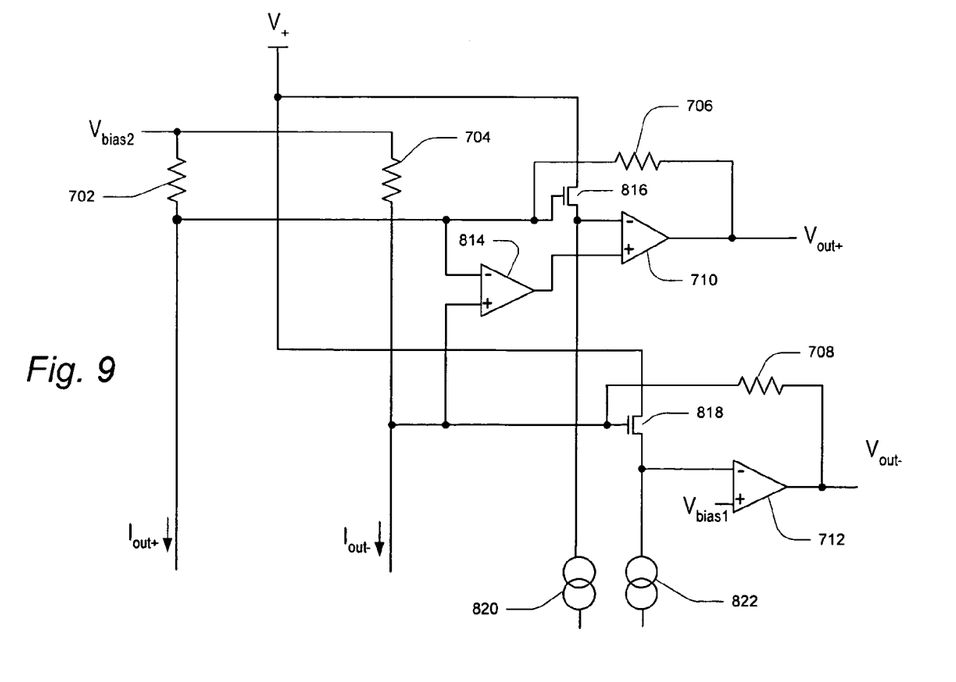
FIG. 9 shows one embodiment of the composite differential I/V design shown in FIG. 8, with improved bias current reduction.

In one embodiment of the circuit shown in FIG. 8, the op-amps are designed using discrete field effect transistors (FETs) to reduce bias current, as illustrated in FIG. 9. FETs 816 and 818 may be coupled between a positive rail voltage $V_+$ and respective biasing current sources 820 and 822, further coupling to op-amps 710 and 712, respectively, as shown. It should be noted that in certain embodiments, FETs 816 and 818 may impact the accuracy of the current sensing potential. It should also be noted that those skilled in the art would recognize that any one or more of a variety of pre-existing op-amps may also be used, and/or the op-amps may be implemented using alternate components.

Figure 10:
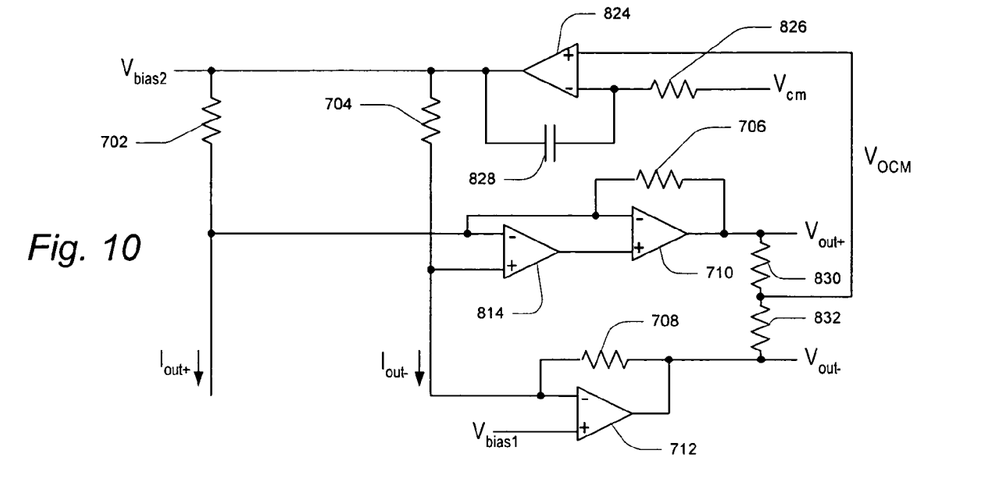
FIG. 10 illustrates one embodiment of the circuit shown in FIG. 8, with the output common-mode voltage being set with common-mode feedback.

The output common-mode voltage of the circuit shown in FIGS. 8 and 9 may be set according to a common-mode feedback configuration as illustrated in FIG. 10. For purposes of illustrating the common-mode feedback configuration, FETs 816 and 818 and their corresponding biasing current sources 820 and 822 have been omitted from FIG. 10. However, while not shown, the common-mode feedback circuitry may be equally applied to the circuit shown in FIG. 9. Both $V_{out+}$ and $V_{out-}$ are now responsive to a differential current defined by $I_{out+}$ and $I_{out-}$, as opposed to being individually responsive to $I_{out+}$ and $I_{out-}$, respectively. Additionally, without common-mode feedback, all supply voltages and bias currents may need to be set precisely in order to obtain the correct output common-mode voltage. Series coupled resistors 830 and 832 may be configured between $V_{out+}$ and $V_{out-}$, and output common-mode voltage $V_{OCM}$ may be fed back to the non-inverting input of op-amp 824. A common-mode voltage input $V_{CM}$ may be coupled to the inverting input of op-amp 824 through resistor 826, providing a feedback loop to $V_{bias2}$ through feedback capacitor 828 and the coupled output of op-amp 824.

Figure 11:
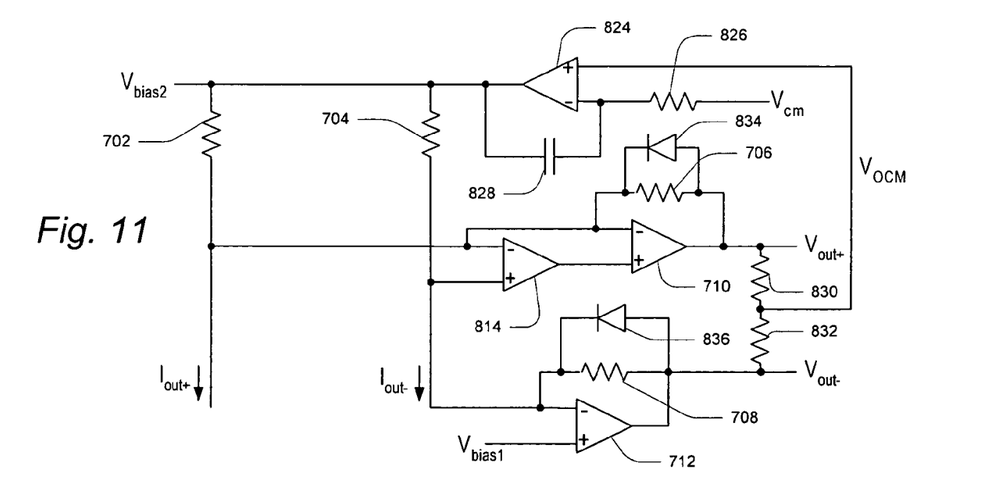
FIG. 11 illustrates one embodiment of the circuit of FIG. 10, with the output clamping being implemented using two diodes.

The circuit shown in FIG. 10 may be configured with output clamping using two diodes 834 and 836 as illustrated in FIG. 11. Diode 834 may keep output voltage $V_{out+}$ from exceeding a voltage level that is the equivalent of the I/V converter's corresponding current-sensing node, which is the node coupled to the inverting inputs of op-amps 710 and 814. Similarly, diode 836 may keep output voltage $V_{out-}$ from exceeding a voltage level that is the equivalent of the IV converter's corresponding current-sensing node, which is the node coupled to the inverting input of op-amp 712 and to the non-inverting input of op-amp 814. Common-mode feedback ensures that when one voltage output, for example $V_{out+}$, is clamped in the positive direction, the other voltage output, for example $V_{out-}$, is clamped in the negative direction. In one set of embodiments, the diodes may be base-collector junctions of high-speed bipolar junction transistors (BJTs), which may provide a combination of low capacitance, low leakage, and high speed. In alternate embodiments, the diodes may be implemented using other structures and/or designs functionally equivalent to diodes.

Figure 12:
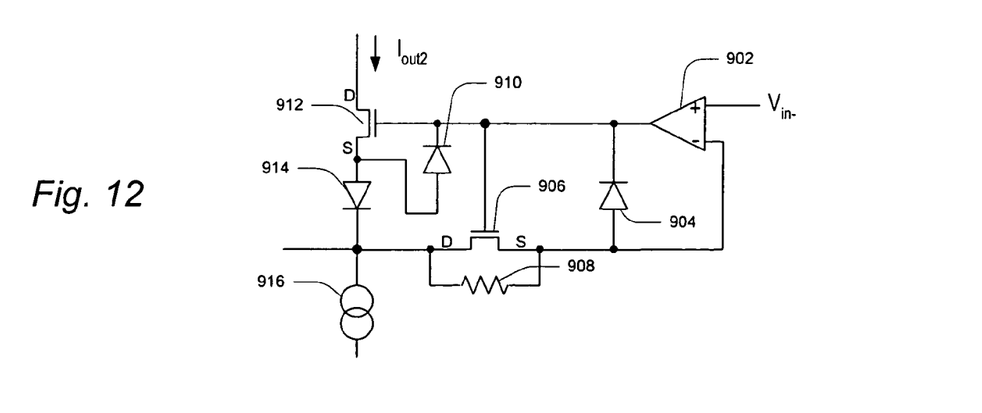
FIG. 12 illustrates one embodiment of a circuit designed to prevent saturation of the opamps shown in FIG. 4-FIG. 6, without causing extra current flow.

Referring back now to FIG. 4, the precision current conveyors may be designed to prevent op-amp saturation without causing extra current flow. In embodiments where the current conveyors are constructed using op-amps, such as op-amps 402 and 404, the op-amps may force the current-sensing voltage to be held accurately at a level substantially commensurate with the op-amp input. In such structures, overload conditions may result in the circuit continuing to force the current-sensing voltage to reside at the correct level, allowing excess current to flow, or the feedback loop around the op-amp may become disconnected and/or non-functional, allowing the op-amp to saturate. FIG. 12 illustrates one embodiment of a circuit designed to prevent excess current flow and/or to maintain a stable feedback loop during overload conditions. Each op-amp circuit portion of the circuit in FIG. 4, for example, may be modified as shown in FIG. 12. An extra FET 906 in the feedback path may open up during overload, enabling diode clamp 904 to keep op-amp 902 from saturating. Resistance 908 may be coupled across FET 906 to bias diode 904, whereas diode 904 may operate to insure that FET 906 operates within its voltage limit. Similarly, diode 914 may operate to insure that FET 912 operates within its voltage limit. Additionally, diode 910 coupled across the source and gate of FET 912 may prevent turning on a parasitic BJT component of FET 912, and diode 904 may similarly prevent turning on a parasitic BJT component of FET 906.

Figure 13:
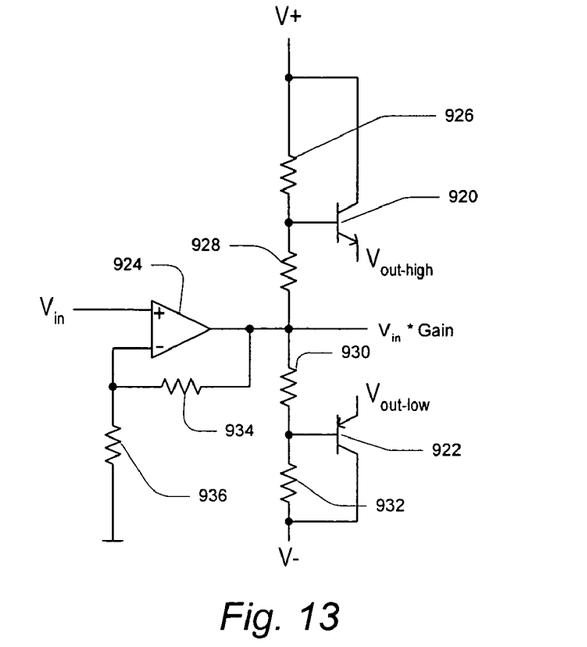
FIG. 13 illustrates one embodiment of a bootstrapping circuit for the input op-amps shown in FIG. 4-FIG. 6.

In one set of embodiments, op-amps used in implementing precision current conveyors may be bootstrapped by moving the supply rails with the input and output signals, in order to improve the op-amps' large-signal behavior, including slew rate and common-mode rejection. FIG. 13 illustrates one embodiment of a bootstrapping circuit that may be used to provide the positive and negative supply rail voltages to op-amps such as op-amps 402 and 404 of FIG. 4, for example. As shown in FIG. 13, supply rail voltages $V_{out-high}$ and $V_{out-low}$ may be generated for a bootstrapped op-amp, for example op-amp 402, by amplifying the input signal $V_{in}$ (labeled $V_{in+}$ for op-amp 402) by a small gain (for example 1.25), and then dividing the signal back down with respect to power supply voltages V+ and V−, respectively. $V_{out-high}$ and $V_{out-low}$ may be provided by bipolar junction transistors (BJT) 920 and 922, respectively, tapped at the corresponding emitters. As a result, input signal $V_{in}$ may be shifted up or down by a fraction of the supply voltage V+ or V−. Providing a gain makes it possible for op-amp 924 to provide some input capacitance and dielectric absorption (DA) cancellation through positive feedback. Op-amp 924 may be selected to be a high-speed op-amp, which may result in greater accuracy and regulation than would a comparable open-loop design.

Figure 14:
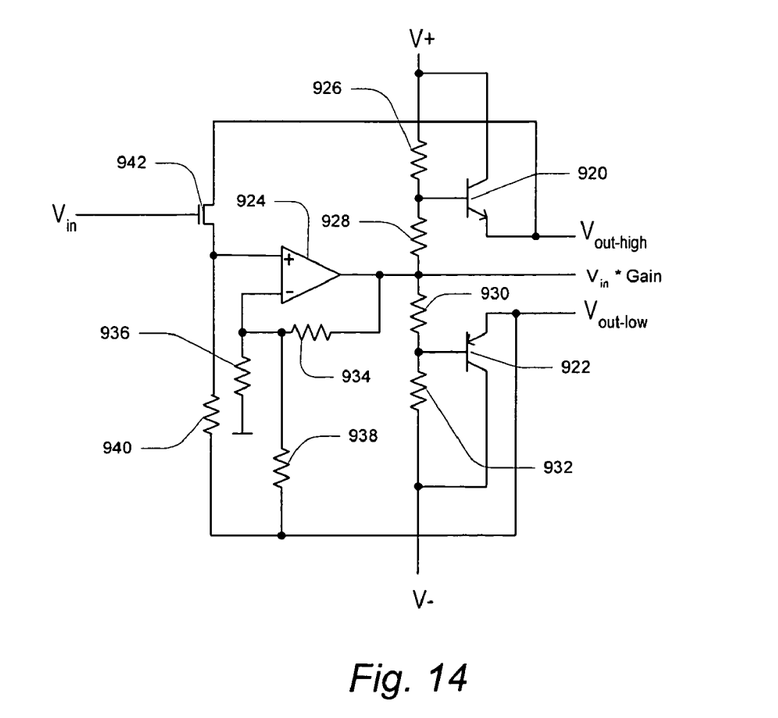
FIG. 14 illustrates one embodiment of the op-amp circuit shown in FIG. 13, with the op-amp preceded by a FET biased from the outputs for bias current reduction.

FIG. 14 shows another embodiment of an op-amp bootstrapping circuit, based on the bootstrapping circuit shown in FIG. 13. In this embodiment, op-amp 924 may be preceded by a FET 942 to provide bias current reduction, where FET 942 may be biased from output $V_{out-high}$, and output $V_{out-low}$ through resistor 940. A voltage error that may be introduced by the gate-source voltage of FET 942 may be cancelled using resistor 938 coupled between output $V_{out-low}$ and the inverting input of op-amp 924. While this cancellation may be imperfect as the required correction will be dependent on the characteristics of specific FET device 942, it may shift the mean of the offset error closer to a value of zero, effectively reducing the dynamic range requirements of op-amp 924. It should also be noted that while resistor 938 is shown to be coupled between negative output voltage $V_{out-low}$ and the inverting input of op-amp 924, resistor 938 may equally be coupled between positive output voltage $V_{out-high}$ and the inverting input of op-amp 924 to achieve a corresponding effect of the opposite polarity.

As a further improvement, in one set of embodiments, the value of supply rail $V_{bias2}$ (illustrated in FIGS. 7 through 11)

may be elevated to reduce noise. Current-mode PGIAs typically depend on quiet current sources for operation. Resistors of considerable value may generate less current-noise than resistors of lower values, thus use of large resistors may be preferred. For a given bias current, resistors of larger values may require larger voltages across their terminals. Furthermore, while in both FIG. 13 and FIG. 14 the collector of BJT 920 is shown to be coupled to V+ and the collector of BJT 922 is shown to be coupled to V−, it should be noted that in alternate embodiments the collector of BJT 920 may be coupled to any DC voltage higher than $V_{out}$ high and the collector of BJT 922 may be coupled to any DC voltage lower than $V_{out\ low}$.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

The invention claimed is:

1. An instrumentation amplifier comprising:
   a pair of operational amplifiers (op-amps), each op-amp having an output, a voltage input configured to receive an input voltage, and a feedback input;
   a pair of current conveying elements, each current conveying element having a sense node, wherein each one of the pair of current conveying elements is configured in a respective feedback loop between the output and the feedback input of a respective one of the pair of op-amps;
   a gain-setting resistive element comprising two or more gain-setting resistors coupled between the sense nodes of the current conveying elements; and
   a pair of multiplexers, wherein each one of the pair of multiplexers is configured to couple any selected one of the two or more gain-setting resistors between the pair of current conveying elements, and to couple the selected one of the two or more gain-setting resistors between the respective sense nodes of the pair of current conveying elements;
   wherein respective currents flowing through the respective current conveying elements form a differential output current, and wherein respective input voltages received by the voltage inputs of the pair of op-amps form a differential input voltage of the instrumentation amplifier.

2. The instrumentation amplifier of claim 1, wherein the instrumentation amplifier is operable to maintain a substantially linear characteristic and substantially constant speed while a gain of the instrumentation amplifier is increased.

3. The instrumentation amplifier of claim 1, wherein each respective one of the pair of op-amps and the respective current conveying element configured in the respective feedback loop between the output and the feedback input of the respective one of the pair of op-amps form a respective precision current conveyor operable to sense the current flowing through the respective current conveying element.

4. The instrumentation amplifier of claim 3, wherein each respective current conveying element comprises a transistor.

5. The instrumentation amplifier of claim 4, wherein each respective precision current conveyor farther comprises a respective biasing current source coupled to the respective current conveying element of the respective precision current conveyor.

6. The instrumentation amplifier of claim 1, wherein the voltage input is configured as a non-inverting input and the feedback input is configured as an inverting input.

7. The instrumentation amplifier of claim 1, further comprising a current-to-voltage (I/V) converter, wherein the I/V converter is operable to convert the differential output current to a differential output voltage.

8. An instrumentation amplifier comprising:
   a pair of operational amplifiers (op-amps), each op-amp having an output, a voltage input configured to receive an input voltage, and a feedback input;
   a pair of current conveying elements, each current conveying element having a sense node, wherein each one of the pair of current conveying elements is configured in a respective feedback loop between the output and the feedback input of a respective one of the pair of op-amps, wherein respective currents flowing through the respective current conveying elements form a differential output current, and wherein respective input voltages received by the voltage inputs of the pair of op-amps form a differential input voltage of the instrumentation amplifier;
   a gain-setting resistive element coupled between the sense nodes of the current conveying elements; and
   an I/V converter operable to convert the differential output current to a differential output voltage comprising:
      a third op-amp having a first input, a second input and an output, wherein the first input of the third op-amp is configured to couple to a respective one of the pair of current conveying elements, and wherein the first input of the third op-amp is further configured to receive a first biasing voltage signal;
      a fourth op-amp having a first input, a second input and an output, wherein the first input of the fourth op-amp is configured to couple to the other one of the pair of current conveying elements, wherein the second input of the fourth op-amp is configured to receive a second biasing voltage signal, and wherein the first input of the third op-amp is further configured to receive the first biasing voltage signal;
      a first feedback resistor configured to couple between the first input and the output of the third op-amp; and
      a second feedback resistor configured to couple between the first input and the output of the fourth op-amp;
      wherein the respective output of the third op-amp and the respective output of the fourth op-amp are configured to provide the differential output voltage.

9. The instrumentation amplifier of claim 8, wherein the second input of the third op-amp is operable to receive the second biasing voltage signal.

10. The instrumentation amplifier of claim 8, wherein the I/V converter further comprises a fifth op-amp having a first input, a second input and an output, wherein the first input of the fifth op-amp is configured to couple to the first input of the third op-amp, wherein the output of the fifth op-amp is configured to couple to the second input of the third op-amp, and wherein the second input of the fifth op-amp is configured to couple to the first input of the fourth op-amp.

11. The instrumentation amplifier of claim 10, wherein the third op-amp and the fourth op-amp have a high operating speed, and wherein the fifth op-amp is configured as a low-noise op-amp.

12. The instrumentation amplifier of claim 10, wherein the I/V converter further comprises:
   a first transistor having first, second, and third terminals, wherein the first terminal of the first transistor is coupled to a positive rail voltage, wherein the second terminal of the first transistor is coupled to a first biasing current source and to the first terminal of the third op-amp, and wherein the third terminal of the first transistor is coupled to the first input of the fifth op-amp; and a second transistor having first, second, and third terminals, wherein the first terminal of the second transistor is coupled to the positive rail voltage, wherein the second terminal of the second transistor is coupled to a second biasing current source and to the first terminal of the fourth op-amp, and wherein the third terminal of the second transistor is coupled to the second input of the fifth op-amp.

13. The instrumentation amplifier of claim 10, wherein the I/V converter further comprises:

a sixth op-amp having a first input, a second input and an output, wherein the output of the sixth op-amp is configured to generate the first biasing voltage signal;

a capacitor configured to couple between the first input and the output of the sixth op-amp;

a third resistor configured to couple between the first input of the sixth op-amp and a common-mode voltage input;

a fourth resistor configured to couple between the output of the third op-amp and a common-mode node; and a fifth resistor configured to couple between the output of the fourth op-amp and the common-mode node;

wherein the common-mode node is configured to provide a common-mode output voltage corresponding to the differential output voltage, and further configured to couple to the second input of the sixth op-amp.

14. The instrumentation amplifier of claim 13, wherein the I/V converter further comprises:

a first clamping element coupled across the first feedback resistor; and a second clamping element coupled across the second feedback resistor.

15. The instrumentation amplifier of claim 14, wherein the first clamping element and the second clamping element each comprise a respective diode.

16. An instrumentation amplifier comprising:

a pair of operational amplifiers (op-amps), each op-amp having an output, a voltage input configured to receive an input voltage, and a feedback input;

a pair of current conveying elements, each current conveying element having a sense node, wherein each one of the pair of current conveying elements is configured in a respective feedback loop between the output and the feedback input of a respective one of the pair of op-amps, wherein respective currents flowing through the respective current conveying elements form a differential output current, and wherein respective input voltages received by the voltage inputs of the pair of op-amps form a differential input voltage of the instrumentation amplifier;

a gain-setting resistive element coupled between the sense nodes of the current conveying elements; and one ore more of:

a first rectifier configured to couple between the respective output and the feedback input of one of the pair of op-amps; and a second rectifier configured to couple between the respective output and the respective feedback input of the other one of the pair of op-amps;

one or more of:

a first transistor configured between the respective feedback input of one of the pair of op-amps and the sense node of the respective one of the pair of current conveying elements configured in the respective feedback loop between the output and the feedback input of the one of the pair of op-amps; and a second transistor configured between the respective feedback input of the other one of the pair of op-amps and the sense node of the respective other one of the pair of current conveying elements configured in the respective feedback loop between the output and the feedback input of the other one of the pair of op-amps; and one or more of:

a first biasing resistor configured to couple across the first transistor; and a second biasing resistor configured to couple across the second transistor.

17. The instrumentation amplifier of claim 16, further comprising one or more of:

a third rectifier configured to couple between the first transistor and the respective one of the pair of current conveying elements configured in the respective feedback loop between the output and the feedback input of the one of the pair of op-amps; and a fourth rectifier configured to couple between the second transistor and the respective other one of the pair of current conveying elements configured in the respective feedback loop between the output and the feedback input of the other one of the pair of op-amps.

18. The instrumentation amplifier of claim 17, further comprising one or more of:

a fifth rectifier configured to couple between the output of the one of the pair of op-amps and the respective one of the pair of current conveying elements configured in the respective feedback loop between the output and the feedback input of the one of the pair of op-amps; and a fourth rectifier configured to couple between the output of the other one of the pair of op-amps and the respective other one of the pair of current conveying elements configured in the respective feedback loop between the output and the feedback input of the other one of the pair of op-amps.

19. An instrumentation amplifier comprising:

a pair of operational amplifiers (op-amps), each op-amp having an output, a voltage input configured to receive an input voltage, and a feedback input;

a pair of current conveying elements, each current conveying element having a sense node, wherein each one of the pair of current conveying elements is configured in a respective feedback loop between the output and the feedback input of a respective one of the pair of op-amps, wherein respective currents flowing through the respective current conveying elements form a differential output current, and wherein respective input voltages received by the voltage inputs of the pair of op-amps form a differential input voltage of the instrumentation amplifier;

a gain-setting resistive element coupled between the sense nodes of the current conveying elements; and one or more of:

a first bootstrapping circuit configured to couple to the respective voltage input of one of the pair of op-amps, and further configured to couple to a positive power supply voltage and to a negative power supply voltage, wherein the first bootstrapping circuit is operable to amplify by a small gain a respective first input voltage signal received by the respective voltage input of the one of the pair of op-amps, and to divide the respective first input voltage signal with respect to the positive power supply voltage and the negative power supply voltage; and a second bootstrapping circuit configured to couple to the respective voltage input of the other one of the pair of op-amps, and further configured to couple to the positive power supply voltage and to the negative power supply voltage, wherein the second bootstrapping circuit is operable to amplify by the small gain a respective second input voltage signal received by the respective voltage input of the other one of the pair of op-amps, and to divide the respective second input voltage signal with respect to the positive power supply voltage and the negative power supply voltage.

20. An instrumentation amplifier comprising:

a first op-amp having a first input, a second input and an output, wherein the first input of the first op-amp is configured to receive at least a portion of a first output current and to couple to a first biasing voltage;

a second op-amp having a first input, a second input and an output, wherein the first input of the second op-amp is configured to receive at least a portion of a second output current and to couple to the first biasing voltage, wherein the second input of the second op-amp is configured to couple to a second biasing voltage;

a third op-amp having a first input, a second input and an output, wherein the first input of the third op-amp is configured to couple to the first input of the first op-amp, wherein the output of the third op-amp is configured to couple to the second input of the first op-amp, and wherein the second input of the third op-amp is configured to couple to the first input of the second op-amp;

a first feedback resistor configured to couple between the first input and the output of the first op-amp; and a second feedback resistor configured to couple between the first input and the output of the second op-amp;

wherein the first current and the second current form a differential output current;

wherein the output of the first op-amp and the output of the second op-amp are configured to provide a differential output voltage corresponding to the differential output current.

21. The instrumentation amplifier of claim 20, wherein the first op-amp and the second op-amp have a high operating speed, and wherein the third op-amp is configured as a low-noise op-amp.

22. The instrumentation amplifier of claim 20, further comprising:

a first FET having a gate, a drain and a source, wherein the drain of the first FET is configured to couple to a positive rail voltage, wherein the source of the first FET is configured to couple to a first biasing current source and to the first terminal of the first op-amp, and wherein the gate of the first FET is configured to couple to the first input of the third op-amp; and a second FET having a gate, a drain and a source, wherein the drain of the second FET is configured to couple to the positive rail voltage, wherein the source of the second FET is configured to couple to a second biasing current source and to the first terminal of the second op-amp, and wherein the gate of the first FET is configured to couple to the second input of the third op-amp.

23. The instrumentation amplifier of claim 20, further comprising:

a fourth op-amp having a first input, a second input and an output, wherein the output of the fourth op-amp is configured to generate the first biasing voltage;

a capacitor configured to couple between the first input and the output of the fourth op-amp;

a third resistor configured to couple between the first input of the fourth op-amp and a common-mode voltage input;

a fourth resistor configured to couple between the output of the first op-amp and a common-mode node; and a fifth resistor configured to couple between the output of the second op-amp and the common-mode node;

wherein the common-mode node is configured to provide a common-mode output voltage corresponding to the differential output voltage, and further configured to couple to the second input of the fourth op-amp.

24. The instrumentation amplifier of claim 23, further comprising:

a first clamping element coupled across the first feedback resistor; and a second clamping element coupled across the second feedback resistor.

25. The instrumentation amplifier of claim 24, wherein the first clamping element and the second clamping element each comprise a respective diode.

26. The instrumentation amplifier of claim 1, further comprising:

one ore more of:

a first rectifier configured to couple between the respective output and the feedback input of one of the pair of op-amps; and a second rectifier configured to couple between the respective output and the respective feedback input of the other one of the pair of op-amps;

one or more of:

a first transistor configured between the respective feedback input of one of the pair of op-amps and the sense node of the respective one of the pair of current conveying elements configured in the respective feedback loop between the output and the feedback input of the one of the pair of op-amps; and a second transistor configured between the respective feedback input of the other one of the pair of op-amps and the sense node of the respective other one of the pair of current conveying elements configured in the respective feedback loop between the output and the feedback input of the other one of the pair of op-amps; and one or more of:

a first biasing resistor configured to couple across the first transistor; and a second biasing resistor configured to couple across the second transistor.

27. The instrumentation amplifier of claim 26, further comprising one or more of:

a third rectifier configured to couple between the first transistor and the respective one of the pair of current conveying elements configured in the respective feedback loop between the output and the feedback input of the one of the pair of op-amps; and a fourth rectifier configured to couple between the second transistor and the respective other one of the pair of current conveying elements configured in the respective feedback loop between the output and the feedback input of the other one of the pair of op-amps.

28. The instrumentation amplifier of claim 27, further comprising one or more of:
- a fifth rectifier configured to couple between the output of the one of the pair of op-amps and the respective one of the pair of current conveying elements configured in the respective feedback loop between the output and the feedback input of the one of the pair of op-amps; and a fourth rectifier configured to couple between the output of the other one of the pair of op-amps and the respective other one of the pair of current conveying elements configured in the respective feedback loop between the output and the feedback input of the other one of the pair of op-amps.

29. The instrumentation amplifier of claim 1, further comprising one or more of:
- a first bootstrapping circuit configured to couple to the respective voltage input of one of the pair of op-amps, and further configured to couple to a positive power supply voltage and to a negative power supply voltage;
  wherein the first bootstrapping circuit is operable to amplify by a small gain a respective first input voltage signal received by the respective voltage input of the one of the pair of op-amps, and to divide the respective first input voltage signal with respect to the positive power supply voltage and the negative power supply voltage; and
- a second bootstrapping circuit configured to couple to the respective voltage input of the other one of the pair of op-amps, and further configured to couple to the positive power supply voltage and to the negative power supply voltage;

wherein the second bootstrapping circuit is operable to amplify by the small gain a respective second input voltage signal received by the respective voltage input of the other one of the pair of op-amps, and to divide the respective second input voltage signal with respect to the positive power supply voltage and the negative power supply voltage.

* * * * *